United States Patent
Nakamura et al.

(10) Patent No.: US 10,208,175 B2
(45) Date of Patent: Feb. 19, 2019

(54) FLAME-RETARDANT BIAXIALLY ORIENTED POLYESTER FILM, AND FLAME-RETARDANT POLYESTER FILM LAMINATE COMPRISING THE SAME AND FLEXIBLE CIRCUIT BOARD

(71) Applicant: Teijin Dupont Films Japan Limited, Tokyo (JP)

(72) Inventors: Yumiko Nakamura, Gifu (JP); Naomi Mizuno, Gifu (JP); Taro Oya, Gifu (JP)

(73) Assignee: Teijin DuPont Films Japan Limited, Tokyo (JP)

( * ) Notice: Subject to any disclaimer, the term of this patent is extended or adjusted under 35 U.S.C. 154(b) by 53 days.

(21) Appl. No.: 14/915,937

(22) PCT Filed: Oct. 23, 2014

(86) PCT No.: PCT/JP2014/078219
§ 371 (c)(1),
(2) Date: Mar. 2, 2016

(87) PCT Pub. No.: WO2015/064469
PCT Pub. Date: May 7, 2015

(65) Prior Publication Data
US 2016/0194466 A1    Jul. 7, 2016

(30) Foreign Application Priority Data

Oct. 28, 2013 (JP) ................................. 2013-223284

(51) Int. Cl.
| | | |
|---|---|---|
| *B32B 3/00* | (2006.01) | |
| *B32B 15/08* | (2006.01) | |
| *B32B 15/09* | (2006.01) | |
| *B32B 15/20* | (2006.01) | |
| *B32B 27/18* | (2006.01) | |
| *B32B 27/36* | (2006.01) | |
| *C08L 67/02* | (2006.01) | |
| *C08K 3/016* | (2018.01) | |
| *C08K 5/49* | (2006.01) | |
| *C08K 5/51* | (2006.01) | |
| *C08K 5/53* | (2006.01) | |
| *C08K 5/5313* | (2006.01) | |
| *H05K 1/03* | (2006.01) | |
| *H05K 1/09* | (2006.01) | |

(Continued)

(52) U.S. Cl.
CPC ................ *C08J 5/18* (2013.01); *B32B 15/09* (2013.01); *B32B 27/06* (2013.01); *B32B 27/20* (2013.01); *B32B 27/36* (2013.01); *C08K 5/5313* (2013.01); *H05K 1/028* (2013.01); *H05K 1/0373* (2013.01); *B32B 3/00* (2013.01); *B32B 15/08* (2013.01); *B32B 15/20* (2013.01); *B32B 27/18* (2013.01); *B32B 2250/02* (2013.01); *B32B 2307/202* (2013.01); *B32B 2307/3065* (2013.01); *B32B 2307/518* (2013.01); *B32B 2307/538* (2013.01); *B32B 2307/54* (2013.01); *B32B 2367/00* (2013.01); *B32B 2457/08* (2013.01); *B32B 2457/12* (2013.01); *C08J 2367/02* (2013.01); *C08K 3/016* (2018.01); *C08K 5/49* (2013.01); *C08K 5/51* (2013.01); *C08K 5/53* (2013.01); *C08L 67/02* (2013.01); *C08L 67/03* (2013.01); *H05K 1/03* (2013.01); *H05K 1/0326* (2013.01); *H05K 1/0353* (2013.01); *H05K 1/0393* (2013.01); *H05K 1/09* (2013.01); *H05K 2201/012* (2013.01); *H05K 2201/0145* (2013.01); *H05K 2201/0209* (2013.01); *Y10T 428/24355* (2015.01); *Y10T 428/25* (2015.01); *Y10T 428/31681* (2015.04); *Y10T 428/31786* (2015.04)

(58) Field of Classification Search
None
See application file for complete search history.

(56) References Cited

U.S. PATENT DOCUMENTS

| | | | | |
|---|---|---|---|---|
| 3,900,444 A | * | 8/1975 | Racky | .................. C08K 5/5313 |
| | | | | 524/126 |
| 4,102,853 A | * | 7/1978 | Kawamura | .............. C08K 3/26 |
| | | | | 524/424 |

(Continued)

FOREIGN PATENT DOCUMENTS

| | | |
|---|---|---|
| CN | 103261319 A | 8/2013 |
| JP | 08-73720 A | 3/1996 |

(Continued)

OTHER PUBLICATIONS

Communication dated Nov. 2, 2016, from the European Patent Office in counterpart European Application No. 14858399.0.

(Continued)

*Primary Examiner* — Vivian Chen
(74) *Attorney, Agent, or Firm* — Sughrue Mion, PLLC

(57) ABSTRACT

A flame-retardant biaxially oriented polyester film is obtained by imparting flame retardancy to a polyester film itself using a phosphorus flame retardant, a flame-retardant polyester film laminate is formed from the same, and a flexible circuit board is provided. The present invention is obtained from a flame-retardant biaxially oriented polyester film which contains, based on the weight of the polyester film, 70 to 99.5% by weight of polyethylene terephthalate or polyethylene naphthalate, and 0.5 to 30% by weight of flame retardant particles having an average particle diameter of 0.5 to 3.0 μm and being represented by a specific phosphinate or diphosphinate, wherein the number of coarse particles having a maximum length of 10 μm or more contained in the polyester film is 10/m² or less.

11 Claims, No Drawings

(51) Int. Cl.
*C08J 5/18* (2006.01)
*B32B 27/06* (2006.01)
*B32B 27/20* (2006.01)
*H05K 1/02* (2006.01)
*C08L 67/03* (2006.01)

(56) References Cited

U.S. PATENT DOCUMENTS

| | | | | |
|---|---|---|---|---|
| 4,180,495 A | * | 12/1979 | Sandler | C08K 5/5313 524/133 |
| 4,990,400 A | * | 2/1991 | Endo | C08G 63/82 428/331 |
| 5,626,942 A | * | 5/1997 | Okamoto | B29C 55/005 428/141 |
| 5,780,534 A | | 7/1998 | Kleiner et al. | |
| 5,804,626 A | * | 9/1998 | Rogers | C08L 67/02 524/195 |
| 6,013,707 A | * | 1/2000 | Kleiner | C07F 9/30 524/126 |
| 6,107,385 A | * | 8/2000 | Imahashi | C08K 3/04 524/261 |
| 6,365,071 B1 | * | 4/2002 | Jenewein | C08K 5/3445 252/601 |
| 6,582,789 B1 | * | 6/2003 | Sumi | C09J 7/0285 428/1.1 |
| 6,761,968 B2 | * | 7/2004 | Kusume | B29C 55/12 428/323 |
| 2004/0049063 A1 | * | 3/2004 | Hoerold | C08K 5/5313 556/17 |
| 2004/0161620 A1 | * | 8/2004 | Tanaka | B32B 27/36 428/473.5 |
| 2004/0176506 A1 | * | 9/2004 | Sicken | C07F 9/30 524/115 |
| 2004/0192812 A1 | | 9/2004 | Engelmann et al. | |
| 2004/0225040 A1 | * | 11/2004 | Hoerold | B82Y 30/00 524/115 |
| 2004/0227130 A1 | * | 11/2004 | Hoerold | C08K 5/17 252/601 |
| 2004/0265608 A1 | * | 12/2004 | Pecorini | B29C 55/12 428/480 |
| 2005/0032958 A1 | * | 2/2005 | Bauer | C08K 5/5313 524/415 |
| 2005/0101706 A1 | * | 5/2005 | Bauer | C08K 5/5313 524/115 |
| 2005/0101707 A1 | * | 5/2005 | Bauer | C08K 5/5313 524/115 |
| 2005/0234161 A1 | * | 10/2005 | Steib | C08K 5/34928 524/115 |
| 2005/0272839 A1 | * | 12/2005 | Bauer | C08K 5/5313 524/115 |
| 2006/0020064 A1 | * | 1/2006 | Bauer | B82Y 30/00 524/115 |
| 2006/0089435 A1 | * | 4/2006 | Hoerold | C08K 3/22 524/115 |
| 2006/0134409 A1 | * | 6/2006 | Pecorini | C08J 5/18 428/355 R |
| 2008/0241452 A1 | * | 10/2008 | Kondo | B32B 7/12 428/40.1 |
| 2010/0240814 A1 | | 9/2010 | Kong et al. | |
| 2010/0324182 A1 | | 12/2010 | Ing.Roth | |
| 2011/0245386 A1 | * | 10/2011 | Hill | C07F 9/301 524/135 |
| 2011/0251315 A1 | * | 10/2011 | Hill | C07F 9/301 524/133 |
| 2011/0305913 A1 | * | 12/2011 | Hinton | B29C 47/0021 428/480 |
| 2012/0206891 A1 | * | 8/2012 | Yoshioka | H01L 21/4846 361/783 |
| 2014/0158195 A1 | * | 6/2014 | Shirokura | B29C 55/143 136/256 |

FOREIGN PATENT DOCUMENTS

| | | | |
|---|---|---|---|
| JP | 2000-315620 A | * | 11/2000 |
| JP | 2004-537630 A | | 12/2004 |
| JP | 2007-9111 A | | 1/2007 |
| JP | 2009-30044 A | | 2/2009 |
| JP | 2009-179037 A | | 8/2009 |
| JP | 2009-215347 A | * | 9/2009 |
| JP | 2010-89334 A | | 4/2010 |
| JP | 2010-174223 A | * | 8/2010 |
| JP | 2010169810 A | | 8/2010 |
| JP | 2010-229390 A | | 10/2010 |
| JP | 2011-506723 A | | 3/2011 |
| JP | 2012-051953 A | * | 3/2012 |
| JP | 2014-088582 A | * | 5/2014 |
| WO | 2008/143196 A1 | | 11/2008 |
| WO | 2012/090732 A1 | | 7/2012 |
| WO | WO 2012/090732 A | * | 7/2012 |
| WO | WO 2013/027678 A | * | 2/2013 |

OTHER PUBLICATIONS

Communication dated Oct. 17, 2016, from the European Patent Office in counterpart European Application No. 14858399.0.
International Search Report of PCT/JP2014/078219 dated Jan. 27, 2015.

* cited by examiner

FLAME-RETARDANT BIAXIALLY ORIENTED POLYESTER FILM, AND FLAME-RETARDANT POLYESTER FILM LAMINATE COMPRISING THE SAME AND FLEXIBLE CIRCUIT BOARD

CROSS REFERENCE TO RELATED APPLICATIONS

This application is a National Stage of International Application No. PCT/JP2014/078219 filed on Oct. 23, 2014 (claiming priority based on Japanese Patent Application No. 2013-223284 filed Oct. 28, 2013), the contents of which are incorporated herein by reference in their entirety.

TECHNICAL FIELD

The present invention relates to a biaxially oriented polyester film having flame retardancy, and a flame-retardant polyester film laminate comprising the same and a flexible circuit board, and more particularly to a flame-retardant biaxially oriented polyester film which has excellent flame retardancy and which is suppressed in the lowering of film-forming properties and the lowering of mechanical properties, and a flame-retardant polyester film laminate comprising the same and a flexible circuit board.

BACKGROUND ART

As techniques for electronic devices, such as a mobile phone, are making progress, demand for flexible printed circuit (hereinafter, frequently abbreviated to "FPC") boards is rapidly increasing. In recent years, the Product Liability Act has become effective and thus, for securing the safety measures for preventing a fire, it is desired to impart flame retardancy to a resin used in a FPC.

Halogen flame retardants conventionally used, such as an organohalogen compound and a halogen-containing organophosphorus compound, have high flame retardancy effect, but a possibility is pointed out that the halogen flame retardant liberates a halogen during molding or processing to generate corrosive hydrogen halide gas, causing a molding or processing apparatus to suffer corrosion or causing the working atmosphere to be poor. Further, a possibility that the halogen flame retardant generates a gas of hydrogen halide or the like when suffering burning, such as a fire, is pointed out. For this reason, recently, it is desired to use a flame retardant containing no halogen as a substitute for the halogen flame retardant.

A polyester film, particularly a biaxially stretched film using polyethylene terephthalate or polyethylene naphthalate has excellent mechanical properties and excellent heat resistance as well as excellent chemical resistance, and therefore has been widely used as a material for a magnetic tape, a photographic film, a film for packaging, a film for an electronic part, an electrical insulating film, a film for a metal laminate, a protective film, and the like.

As a method for imparting flame retardancy to a polyester resin, a method of copolymerizing a phosphorus compound with a polyester has been studied. For example, JP-A-2007-9111 (PTL 1) discloses that, by using a small amount of a specific carboxyphosphinic acid component among carboxyphosphinic acid components, high flame retardancy can be imparted to polyethylene-2,6-naphthalenedicarboxylate without using other phosphorus compounds in combination. The polyethylene-2,6-naphthalenedicarboxylate film containing the carboxyphosphinic acid compound disclosed in PTL 1 exhibits high flame retardancy in the form of a film. However, with respect to the flame retardancy after the film is processed for an application of a flexible printed circuit or the like, the flame retardancy of the film was unlikely to be reproduced.

As another phosphorus flame retardant, for example, JP-A-2009-179037 (PTL 2) and JP-A-2010-89334 (PTL 3) have proposed a laminate film having laminated on a polyester film a flame retardant layer containing an inorganic metal phosphoric acid derivative, such as a metal phosphinate. However, the proposed laminate film was a technique in which, in view of high burning properties of a porous substrate film due to the voids structure inside of the film, a flame retardant layer using a flame retardant and a curing agent is formed on a substrate film. Further, JP-A-2010-229390 (PTL 4) has a description about a composition having incorporated thereinto an inorganic metal phosphoric acid derivative and a flame-retardant covered electric wire, and these are a technique for imparting flame retardancy to a thermoplastic elastomer resin. The thermoplastic elastomer resin is a resin having a high elongation, and hence encounters almost no problem of a lowering of the physical properties due to the addition of a flame retardant. International Publication No. WO2012/090732 pamphlet (PTL 5) has proposed aflame-retardant polyester film containing a phosphinate or a diphosphinate, and has proposed a flame-retardant biaxially oriented polyester film which is obtained by imparting flame retardancy to a polyester film itself, such as polyalkylene terephthalate or polyalkylene naphthalate, using a phosphorus flame retardant, and which is suppressed in the lowering of a hydrolytic resistance due to the flame retardant.

PTL 1: JP-A-2007-9111
PTL 2: JP-A-2009-179037
PTL 3: JP-A-2010-89334
PTL 4: JP-A-2010-229390
PTL 5: WO2012/090732 pamphlet

DISCLOSURE OF INVENTION

Technical Problem

The present inventors have found, in the course of the studies made on a polyester film using a phosphinate or a diphosphinate as a flame retardant, new problems that when the above flame retardant is added to a polyester film, the film-forming properties are likely to be lowered, and that the obtained film is likely to be lowered in the mechanical strength.

Accordingly, an object of the present invention is to solve the above-mentioned problems, and to provide a flame-retardant biaxially oriented polyester film which is obtained by imparting flame retardancy to a polyester film itself, such as polyethylene terephthalate or polyethylene naphthalate, using a phosphorus flame retardant, and which is suppressed in the lowering of a hydrolytic resistance due to the flame retardant and further suppressed in the lowering of film-forming properties and the lowering of mechanical properties due to the flame retardant, and a flame-retardant polyester film laminate comprising the same and a flexible circuit board.

Solution to Problem

The present inventors have conducted extensive and intensive studies with a view toward solving the above-mentioned problems. As a result, it has been found that a phosphinate or a diphosphinate is not compatible with a polyester and is present in the film in the form of foreign matter, such as particles, and further the ratio of the phosphinate or diphosphinate present in the form of coarse particles is high, and thus these factors cause a lowering of the film-forming properties and a lowering of the mechanical properties, and that, by controlling the particle diameter of the flame retardant particles and the frequency of coarse flame retardant particles, the film-forming properties and mechanical strength are improved, and the present invention has been completed.

Specifically, the object of the invention is attained by (Item 1) a flame-retardant biaxially oriented polyester film which contains, based on the weight of the polyester film, 70 to 99.5% by weight of polyethylene terephthalate or polyethylene naphthalate, and 0.5 to 30% by weight of flame retardant particles having an average particle diameter of 0.5 to 3.0 μm and being represented by the following formula (1) or formula (2):

[Chem. 1]

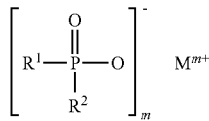

(1)

wherein each of $R^1$ and $R^2$ represents hydrogen, an alkyl group having 1 to 6 carbon atoms and/or an aryl group, M represents a metal, and m represents a valence of M,

[Chem. 2]

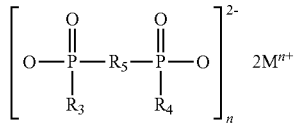

(2)

wherein each of $R^3$ and $R^4$ represents hydrogen, an alkyl group having 1 to 6 carbon atoms and/or an aryl group, $R^5$ represents an alkylene group having 1 to 6 carbon atoms or an arylene group, alkylarylene group, or arylalkylene group having 6 to 10 carbon atoms, M represents a metal, and n represents a valence of M, wherein the number of coarse particles having a maximum length of 10 μm or more contained in the polyester film is 10/m² or less.

The flame-retardant biaxially oriented polyester film of the invention preferably encompasses the following embodiments.

(Item 2) The flame-retardant biaxially oriented polyester film according to item 1 above, which has a mechanical strength of 150 MPa or more.

(Item 3) The flame-retardant biaxially oriented polyester film according to item 1 or 2 above, wherein the polyester film obtained after being treated in a saturated steam at 121° C. under 2 atm for 10 hours has a tensile strength retention ratio of 80% or more.

(Item 4) The flame-retardant biaxially oriented polyester film according to any one of items 1 to 3 above, which has a surface roughness Ra of 0.1 to less than 0.5 μm.

Further, the present invention encompasses the following embodiments of inventions.

(Item 5) A flame-retardant polyester film laminate comprising the flame-retardant biaxially oriented polyester film according to any one of items 1 to 4 above and a metal layer, the polyester film and the metal layer being laminated on one another.

(Item 6) The flame-retardant polyester film laminate according to item 5 above, which is for use in a flexible printed circuit board.

(Item 7) A flexible circuit board using the flame-retardant polyester film laminate according to item 5 or 6 above.

Advantageous Effects of Invention

In the invention, the flame-retardant biaxially oriented polyester film of the invention has excellent film-forming properties, and has high flame retardancy without lowering the mechanical properties and hydrolytic resistance of a polyester, such as polyethylene terephthalate or polyethylene naphthalate, and therefore can be advantageously used in, for example, a flexible printed circuit board, a flat cable, and a back sheet for solar cell.

DESCRIPTION OF EMBODIMENTS

Hereinbelow, the present invention will be described in detail.

<Flame-Retardant Biaxially Oriented Polyester Film>

The flame-retardant biaxially oriented polyester film of the invention contains, based on the weight of the polyester film, 70 to 99.5% by weight of polyethylene terephthalate or polyethylene naphthalate as a polymer component, and 0.5 to 30% by weight of flame retardant particles having an average particle diameter of 0.5 to 3.0 μm and being represented by the following formula (1) or formula (2):

[Chem. 3]

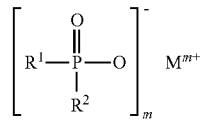

(1)

wherein each of $R^1$ and $R^2$ represents hydrogen, an alkyl group having 1 to 6 carbon atoms and/or an aryl group, M represents a metal, and m represents a valence of M,

[Chem. 4]

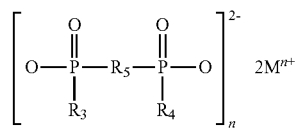

(2)

wherein each of $R^3$ and $R^4$ represents hydrogen, an alkyl group having 1 to 6 carbon atoms and/or an aryl group, $R^5$ represents an alkylene group having 1 to 6 carbon atoms or an arylene group, alkylarylene group, or arylalkylene group having 6 to 10 carbon atoms, M represents a metal, and n represents a valence of M, wherein the number of coarse particles having a maximum length of 10 μm or more contained in the polyester film is 10/m² or less.

(Polyester)

The flame-retardant biaxially oriented polyester film of the invention uses polyethylene terephthalate or polyethylene naphthalate as a polymer component. The amount of the polymer component contained is in the range of 70 to 99.5% by weight, based on the weight of the polyester film. The lower limit of the amount of the polymer component contained is preferably 75% by weight, more preferably 78% by weight, further preferably 80% by weight, especially preferably 85% by weight.

Further, in connection with the amount of the below-mentioned flame retardant component contained, the upper limit of the amount of the polymer component contained is preferably 99% by weight, more preferably 96% by weight, further preferably 92% by weight, especially preferably 90% by weight.

When the amount of the polymer component contained is less than the lower limit, the film is lowered in the mechanical strength. On the other hand, when the amount of the polymer component contained exceeds the upper limit, the amount of the flame retardant component contained becomes relatively small, so that satisfactory flame retardancy is not exhibited.

The polyethylene terephthalate or polyethylene naphthalate in the invention may be a copolymer having a component other than the main component (hereinafter, frequently referred to as "copolymer component") in such an amount that the effects aimed at by the invention are not sacrificed, and the copolymer component can be used preferably in an amount of less than 25 mol %, more preferably 20 mol % or less, further preferably 15 mol % or less, based on the mole of the all repeating units of the polyester.

Examples of the copolymer components include dicarboxylic acids, such as oxalic acid, adipic acid, phthalic acid, sebacic acid, dodecanedicarboxylic acid, isophthalic acid, terephthalic acid, 1,4-cyclohexanedicarboxylic acid, 4,4'-diphenyldicarboxylic acid, phenylindandicarboxylic acid, 2,6-naphthalenedicarboxylic acid, 2,7-naphthalenedicarboxylic acid, tetralindicarboxylic acid, decalindicarboxylic acid, and diphenyl ether dicarboxylic acid; oxycarboxylic acids, such as p-oxybenzoic acid and p-oxyethoxybenzoic acid; and diols, such as ethylene glycol, trimethylene glycol, tetramethylene glycol, hexamethylene glycol, cyclohexanedimethanol, neopentyl glycol, an ethylene oxide addition product of bisphenol sulfone, an ethylene oxide addition product of bisphenol A, diethylene glycol, and polyethylene oxide glycol, and, of these, a component other than the main component can be preferably used. These copolymer components may be used individually or in combination.

The copolymer component may be one which is incorporated as a monomer component and copolymerized, or may be one which is copolymerized by a transesterification reaction with another polyester.

Further, the polyethylene terephthalate or polyethylene naphthalate in the invention may be a blend of at least two types of polyesters or a blend with a thermoplastic resin other than polyester in such a blend ratio that the effects aimed at by the invention are not sacrificed. The other component can be used in an amount of 20% by weight or less, more preferably 15% by weight or less, further preferably 10% by weight or less, based on the weight of the polyester film. Examples of thermoplastic resins other than polyester include polyolefin resins, polystyrene resins, and polyimide resins.

The above polyester preferably has an intrinsic viscosity of 0.4 to 1.5 dl/g, further preferably 0.5 to 1.2 dl/g, as measured at 25° C. using o-chlorophenol as a solvent.

(Flame Retardant Component)

In the invention, as a flame retardant component, a phosphinate represented by the formula (1) below or a diphosphinate represented by the formula (2) below is used in the form of flame retardant particles. Hereinafter, these are frequently collectively referred to as "phosphinate".

[Chem. 5]

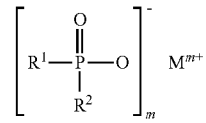

(1)

Wherein each of $R^1$ and $R^2$ represents hydrogen, an alkyl group having 1 to 6 carbon atoms and/or an aryl group, M represents a metal, and m represents a valence of M.

[Chem. 6]

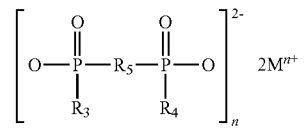

(2)

Wherein each of $R^3$ and $R^4$ represents hydrogen, an alkyl group having 1 to 6 carbon atoms and/or an aryl group, $R^5$ represents an alkylene group having 1 to 6 carbon atoms or an arylene group, alkylarylene group, or arylalkylene group having 6 to 10 carbon atoms, M represents a metal, and n represents a valence of M.

The phosphinate is a compound also called a metal phosphinate, and examples of $R^1$'s and $R^2$'s include hydrogen, a methyl group, an ethyl group, a n-propyl group, an isopropyl group, a n-butyl group, a t-butyl group, a pentyl group, a hexyl group, and a phenyl group. Examples of M's include aluminum, magnesium, and calcium, and valence m is an integer of 2 to 4.

Specific examples include calcium dimethylphosphinate, calcium methylethylphosphinate, calcium diethylphosphinate, calcium phenylphosphinate, calcium biphenylphosphinate, magnesium dimethylphosphinate, magnesium methylethylphosphinate, magnesium diethylphosphinate, magnesium phenylphosphinate, magnesium biphenylphosphinate, aluminum dimethylphosphinate, aluminum methylethylphosphinate, aluminum diethylphosphinate, aluminum phenylphosphinate, and aluminum biphenylphosphinate.

In the diphosphinate, examples of $R^3$'s and $R^4$'s include hydrogen, a methyl group, an ethyl group, a n-propyl group, an isopropyl group, a n-butyl group, a t-butyl group, a pentyl group, a hexyl group, and a phenyl group, and examples of $R^5$'s include a methylene group, an ethylene group, a propylene group, a butylene group, a pentylene group, a hexylene group, and a phenylene group. Examples of M's include aluminum, magnesium, and calcium, and valence n is an integer of 2 to 4.

Examples of diphosphinates represented by the formula (2) include calcium alkanebisphosphinate, such as calcium ethane-1,2-bis(phosphinate), calcium alkanebis(alkylphosphinate), such as calcium ethane-1,2-bis(methylphosphinate), magnesium alkanebisphosphinate, magnesium alkanebis(alkylphosphinate), aluminum alkanebisphosphinate, and aluminum alkanebis(alkylphosphinate).

Of these phosphinates, aluminum diethylphosphinate is especially preferred.

In the invention, the above-mentioned phosphinate is used as a flame retardant component and therefore, as compared to a conventional phosphorus flame retardant, the phosphinate is unlikely to cause a polyester having a high strength, such as polyethylene terephthalate or polyethylene naphthalate, to be lowered in the physical properties, and hence the flame retardant component can be added in such a large amount that a conventional flame retardant has not been able to be added. When processed, for example, for an application in which the flame-retardant polyester film and a metal layer are laminated, conventionally, the resultant metal laminate was lowered in the flame retardancy, as compared to the flame-retardant polyester film before laminated on a metal layer, whereas the invention has a characteristic feature that, in such a case, high flame retardancy equivalent to that of the flame-retardant polyester film itself before laminated can be achieved.

The amount of the phosphinate contained is 0.5 to 30% by weight, based on the weight of the polyester film. The lower limit of the amount of the phosphinate contained is preferably 1% by weight, more preferably 4% by weight, further preferably 8% by weight, especially preferably 10% by weight. Further, the upper limit of the amount of the phosphinate contained is preferably 25% by weight, more preferably 22% by weight, further preferably 20% by weight, especially preferably 15% by weight. When the amount of the phosphinate contained is less than the lower limit, the flame retardancy is unsatisfactory. On the other hand, when the amount of the phosphinate contained exceeds the upper limit, the film-forming properties and mechanical strength are lowered.

The phosphinate has a shape of particles, and is referred to as flame retardant particles in the invention. The flame retardant particles in the invention have an average particle diameter of 0.5 to 3.0 µm, and the lower limit of the average particle diameter is preferably 1.0 µm, further preferably 1.5 µm. The upper limit of the average particle diameter of the flame retardant particles is preferably 2.5 µm. When the average particle diameter is less than the lower limit, it is likely that the handling properties of the film being formed become poor or the dispersibility of the particles in the film becomes unsatisfactory. On the other hand, when the average particle diameter exceeds the upper limit, it is likely that the film being formed is easily broken to lower the film-forming properties, or, even though the film can be formed, the film is lowered in strength.

Further, it is necessary that the number of coarse particles having a maximum length of 10 µm or more contained in the flame-retardant biaxially oriented polyester film of the invention be $10/m^2$ or less, and the number is further preferably $5/m^2$ or less. It has been found that the flame retardant particles have a considerably wide particle size distribution and these coarse particles cause the film-forming properties and film strength to be lowered. Specifically, the following has been found. The particle size distribution of the flame retardant particles is very wide in the distribution range, as compared to the particle size distribution of the particles generally used in a polyester film. Therefore, when the flame retardant particles are not subjected to pretreatment prior to the addition, the coarse particles of which the number exceeds the above-mentioned range are present in the film, causing a lowering of the film-forming properties or film strength.

For achieving the number of the coarse particles in the above-mentioned range, for example, prior to the film formation step, the flame retardant particles are subjected to processing, such as pulverization and classification, so as to preliminarily remove the coarse particles, and thus a flame-retardant biaxially oriented polyester film having high mechanical strength and excellent external appearance can be obtained.

An average particle diameter of the flame retardant particles is determined, as described below in the paragraph for the measurement method, by a method in which, with respect to the cross-section of the polyester film, observed at a 3,500-time magnification using Digital Microscope KH-3000, manufactured by HIROX Co., Ltd., 20 particles are sampled, and a maximum length of the particle diameter of each particle is measured, and the maximum and minimum values are removed from the 20 measured values and an average of the 18 values is determined as an average particle diameter.

A maximum length of the coarse particle can be determined by observing the particles magnified 20 times with transmission lighting using a universal projector, and measuring a maximum length of each particle.

(Phosphorus Atom Concentration)

The phosphorus atom concentration in the invention is preferably 0.1 to 7% by weight, based on the weight of the polyester film. Further, the lower limit of the phosphorus atom concentration is more preferably 1.0% by weight, further preferably 2.0% by weight, especially preferably 2.5% by weight. On the other hand, the upper limit of the phosphorus atom concentration is more preferably 6.0% by weight, further preferably 5.0% by weight.

A characteristic feature of the invention resides in that, by using flame retardant particles having a specific size and being formed from the phosphinate in the invention in a polyester having a high strength, such as polyethylene terephthalate or polyethylene naphthalate, the flame retardant particles do not lower the mechanical properties of the polyester, as compared to a conventional addition-type phosphorus component or copolymerization-type phosphorus component.

On the other hand, when the phosphorus atom concentration is increased to more than the upper limit, the amount of the phosphinate added is so large that the resultant film has poor mechanical strength and poor film-forming properties. Further, the invention has a characteristic feature that, even when the phosphorus atom concentration is in the range close to the lower limit thereof, namely, in the range close to the amount of the conventional phosphorus component contained, high flame retardancy is exhibited as compared to that obtained by other phosphorus components, and, when processed for an application in which the flame-retardant polyester film and a metal layer are laminated, high flame retardancy equivalent to that of the flame-retardant polyester film itself before laminated is reproduced. The reason why the effect is exhibited even when the amount of the phosphorus component contained is small is presumed that a radical trapping effect is obtained due to the metal component constituting the phosphinate.

(Other Additives)

In the flame-retardant biaxially oriented polyester film of the invention, for improving the handling properties of the film, innert particles or the like may be added in such an amount that the effects of the invention are not sacrificed. Examples of such innert particles include inorganic particles containing an element belonging to Group IIA, IIB, IVA, or IVB of the Periodic Table (e.g., kaolin, alumina, titanium oxide, calcium carbonate, and silicon dioxide), and particles made of a polymer having a high heat resistance, such as crosslinked silicone resin, crosslinked polystyrene, or crosslinked acrylic resin particles.

When the film contains innert particles, the innert particles preferably have an average particle diameter of 0.001 to 5 μm, and are contained in an amount, based on the weight of the polyester film, of 0.01 to 10% by weight, further preferably 0.05 to 5% by weight, especially preferably 0.05 to 3% by weight.

In the flame-retardant biaxially oriented polyester film of the invention, further, if necessary, an additive, such as a heat stabilizer, an antioxidant, an ultraviolet light absorber, a release agent, a colorant, or an antistatic agent, can be incorporated in such an amount that the effects aimed at by the invention are not sacrificed.

(Thickness of the Film)

In the invention, the polyester film preferably has a thickness of 2 to 200 μm. When an attempt is made to impart flame retardancy to a polyester film by a method of adding a phosphorus flame retardant, the polyester film is lowered in the mechanical properties or hydrolytic resistance. For this reason, conventionally, a method in which flame retardancy is imparted to the polyester film itself using a phosphorus flame retardant is not employed, but a method in which another layer containing a flame retardant is laminated on the polyester film has been employed. In contrast, the invention has a characteristic feature that a phosphorus flame retardant can be added to the polyester film itself having the above-mentioned thickness.

The thickness of the polyester film can be controlled according to the application within the above-mentioned range. For example, in the case of a flat cable application, the thickness of the polyester film is more preferably 2 to 100 μm, further preferably 5 to 75 μm, especially preferably 10 to 50 μm. In the case of a flexible printed circuit board application, the thickness of the polyester film is more preferably 2 to 150 μm, further preferably 5 to 100 μm, especially preferably 10 to 75 μm.

<Surface Roughness of the Polyester Film>

The flame-retardant biaxially oriented polyester film of the invention preferably has a surface roughness Ra (center line average roughness) of 0.1 to less than 2 μm. The upper limit of the surface roughness Ra is more preferably less than 1.5 μm, further preferably less than 1.0 μm, especially preferably less than 0.5 μm. Further, the lower limit of the surface roughness Ra may be 0.2 μm or more, and further may be 0.3 μm or more. The range of the surface roughness Ra is more preferably 0.1 to less than 1.5 μm, further preferably 0.1 to less than 1.0 μm, especially preferably 0.1 to less than 0.5 μm. Further, in the region in which the amount of the flame retardant component of the invention contained is large, the surface roughness may be 0.2 to less than 1.5 μm, 0.3 to less than 1.0 μm, or 0.3 to less than 0.5 μm.

Further, the flame-retardant biaxially oriented polyester film of the invention preferably has an Rmax (maximum height) of less than 3 μm, more preferably less than 2.5 μm, further preferably less than 2.0 μm.

The surface roughness can be achieved by using a specific amount of the flame retardant particles having the above-mentioned average particle diameter and being formed from a phosphinate having the coarse particles removed therefrom.

The flame-retardant biaxially oriented polyester film of the invention has the above-mentioned surface roughness Ra, and therefore, when laminated on another layer through a heat-sealing layer, an adhesive layer, or the like, the adhesion is improved, and thus the flame-retardant biaxially oriented polyester film can be advantageously used in applications of, for example, a flexible circuit board, a flat cable, and a back sheet for solar cell. Meanwhile, when the coarse particles present in the film cause the Rmax to exceed the upper limit, the film-forming properties and the mechanical strength of the film become poor.

Further, when the flame-retardant biaxially oriented polyester film of the invention has a surface roughness Ra of 0.1 to less than 0.5 μm, the film flatness is excellent, and therefore, when the polyester film is used as a flexible circuit board, a very fine circuit pattern of the metal layer can be obtained.

<Mechanical Strength of the Film>

The flame-retardant biaxially oriented polyester film of the invention preferably has a mechanical strength of 150 MPa or more, more preferably 160 MPa or more, further preferably 170 MPa or more, especially preferably 180 MPa or more. Such a mechanical strength of the film can be obtained by incorporating into the polyester film the flame retardant particles which have an average particle diameter in the above-mentioned range, and in which the number of coarse particles having a maximum length of 10 μm or more is reduced to $10/m^2$ or less.

<Hydrolytic Resistance>

With respect to the flame-retardant biaxially oriented polyester film of the invention, it is preferred that the polyester film obtained after being treated in a saturated steam at 121° C. under 2 atm for 10 hours has a tensile strength retention ratio of 80% or more. The film tensile strength retention ratio is further preferably 85% or more. The tensile strength retention ratio indicates a tensile strength retention ratio of the polyester film in at least one direction of the continuous film-forming direction (hereinafter, frequently referred to as "longitudinal direction", "lengthwise direction", or "MD direction") and the direction perpendicular to the continuous film-forming direction (hereinafter, frequently referred to as "width direction", "crosswise direction", or "TD direction"), and it is further preferred that the tensile strength retention ratios in the both directions satisfy the above value.

By using the phosphinate in the invention as a flame retardant component and controlling the average particle diameter of the phosphinate and the number of the coarse particles contained in the film, the flame-retardant biaxially oriented polyester film of the invention has both excellent flame retardancy and excellent hydrolytic resistance, and thus can maintain high film tensile strength retention ratio after subjected to wet heat treatment.

<Method for Producing the Film>

The flame-retardant biaxially oriented polyester film of the invention can be produced using a known method for forming a film, and, for example, can be produced by a method in which polyester containing a phosphinate is satisfactorily dried, and then molten in an extruder at a melting point to a temperature of (melting point+70° C. and melt-extruded through a T-die, and the molten material in a film form is rapidly cooled on a cooling roll (casting drum) to form an unstretched film, and then the unstretched film is subjected to successive or simultaneous biaxially stretching, followed by heat setting. When a film is formed by successive biaxially stretching, the unstretched film is stretched in the lengthwise direction at 60 to 170° C. in the range of 2.3- to 5.5-fold, more preferably 2.5- to 5.0-fold, and then stretched using a tenter in the crosswise direction at 80 to 170° C. in the range of 2.3- to 5.0-fold, more preferably 2.5- to 4.8-fold.

The heat set treatment is preferably heat setting which is conducted under stress or limit shrink at a temperature of 180 to 260° C., more preferably 190 to 240° C., and the heat set time is preferably 1 to 1,000 seconds. In the case of simultaneous biaxially stretching, the above-mentioned stretch temperature, stretch ratio, heat set temperature, and the like can be used. Further, after heat setting, the resultant film may be subjected to relaxation treatment.

<Flame-Retardant Polyester Film Laminate>

The flame-retardant biaxially oriented polyester film of the invention can be used in the form of a flame-retardant polyester film laminate obtained by laminating the polyester film and a metal layer together. The metal layer includes one which is in a form of a layer formed on the film, one which is in a form of a lead wire or the like, one which is in a certain pattern form, such as a circuit, and the like.

The flame-retardant polyester film laminate can be advantageously used in applications that require flame retardancy or a hydrolytic resistance and, for example, there can be mentioned applications, such as a flat cable and a flexible printed circuit board. Further, the polyester film laminate can be used in other applications such that the laminate and a metal layer are put together.

<Flexible Printed Circuit Board>

The flame-retardant biaxially oriented polyester film of the invention and a laminate formed therefrom can be used in a flexible printed circuit board.

When used in such an application, the flame-retardant biaxially oriented polyester film is preferably used in the form of a flexible printed circuit board having a metal layer laminated on one surface of the flame-retardant biaxially oriented polyester film. As an example of the metal layer used in this application, there can be mentioned a copper foil. With respect to the method for bonding the metal layer and the specific method for obtaining a form of the metal layer, there is no particular limitation, and there can be used, for example, a so-called subtractive method in which a metal layer is laminated on the flame-retardant biaxially oriented polyester film, and then the metal layer is subjected to pattern etching, an additive method in which the flame-retardant biaxially oriented polyester film is plated with a metal in a pattern form, or a stamping foil such that a metal layer punched in a pattern form is put on the flame-retardant biaxially oriented polyester film.

A flexible printed circuit board obtained using the flame-retardant polyester film laminate of the invention is advantageous not only in that the polyester film itself has very high flame retardancy and, when processed for a flexible printed circuit board application in which the flame-retardant polyester film and a metal layer are laminated, high flame retardancy equivalent to that of the flame-retardant biaxially oriented polyester film itself before laminated is exhibited, but also in that the flexible printed circuit board has satisfactory mechanical strength and hydrolytic resistance, and therefore it has excellent long-term durability as a flexible printed circuit board. Further, the flame-retardant biaxially oriented polyester film of the invention has excellent folding property, and hence has excellent punchability when processed into a flexible printed circuit board, and further can achieve both flame retardancy and folding property, and therefore a flexible printed circuit board having high flexibility can be obtained.

Further, when the polyester film of the invention has a surface roughness Ra of 0.1 to less than 0.5 μm, the film flatness is excellent, and therefore, when the polyester film is used as a flexible circuit board, a very fine circuit pattern of the metal layer can be obtained.

The flame-retardant biaxially oriented polyester film of the invention and a laminate formed therefrom also have excellent reflectance characteristics, and therefore can be used as a flexible printed circuit board for LED.

EXAMPLES

Hereinbelow, the present invention will be described in more detail with reference to the following Examples, which should not be construed as limiting the scope of the invention. Various property values were measured by the methods described below. In the following Examples, "part(s)" and "%" respectively mean part(s) by weight and % by weight unless otherwise specified.

(1) Type and Content of the Polyester Component

By a $^1$H-NMR measurement and a $^{13}$C-NMR measurement, the polyester component and copolymer component and their contents were specified.

(2) Type of the Phosphorus Component

Using an NMR and an EPMA, the type of the phosphorus component was specified.

(3) Phosphorus Atom Concentration

With respect to the polyester film, a phosphorus atom concentration was determined by calculation from a fluorescent X-ray emission intensity.

(4) Average Particle Diameter of the Flame Retardant Particles

With respect to the cross-section of the polyester film, observed at a 3,500-time magnification using Digital Microscope KH-3000, manufactured by HIROX Co., Ltd., 20 particles were sampled, and a maximum length of the particle diameter of each particle was measured, and the maximum and minimum values were removed from the 20 measured values and an average of the 18 values was determined as an average particle diameter.

(5) Size and the Number of Coarse Particles

The particles were observed by magnifying them 20 times with transmission lighting using a universal projector, and the number of particles having a maximum length of 10 μm or more was counted, and evaluated in accordance with the following criteria. The measured area was 1 m$^2$.

◯: The number of particles having a maximum length of 10 μm or more is 10/m$^2$ or less.

x: The number of particles having a maximum length of 10 μm or more is more than 10/m$^2$.

(6) Film-Forming Properties

The film-forming properties were evaluated from a change (ΔP) of the filter pressure in the film production step.

◯: ΔP=Less than 0.5 MPa/h

Δ: ΔP=0.5 to less than 1.0 MPa/h x: ΔP=1.0 MPa/h or more (7) Mechanical Properties A sample film was cut into a sample having a width of 10 mm and a length of 150 mm, and the sample was set between chucks so that the distance between the chucks was 100 mm, and subjected to tensile test in accordance with JIS-C2151 under conditions such that the rate of pulling was 100 mm/min, and a load and an elongation were read from the obtained load-elongation curve at break. The measurement was conducted 5 times, and an average of the five measured values was determined as a value for result. A breaking strength (MPa) was calculated by dividing the load by the cross-sectional area of the sample before pulling, and an elongation at break was determined as % by making a calculation taking the length of the sample before pulling as 100. The measurement was conducted in a room having controlled the temperature to be 23±2° C. and the humidity to be 50±5%. As a measuring apparatus, Tensilon Model UCT-100, manufactured by Orientec Co., Ltd., was used.
○: The breaking strength is 150 MPa or more.
x: The breaking strength is less than 150 MPa.

(8) Hydrolytic Resistance

A film was cut into a specimen in a strip form having a length of 150 mm×a width of 10 mm, and the specimen was hung using a clip made of stainless steel in an environmental testing machine set at 121° C., at 2 atm, in a wet saturation mode, and at 100% RH. After a lapse of 10 hours, the resultant specimen was removed from the environmental testing machine, and subjected to measurement of a tensile strength. The longitudinal direction of the film was the direction of measurement, and the measurement was conducted 5 times, and an average of the five measured values was determined and a hydrolytic resistance was evaluated in accordance with the criteria shown below. As a measuring apparatus, Tensilon Model UCT-100, manufactured by Orientec Co., Ltd., was used.

Tensile strength retention ratio (%)=(Tensile strength $X$ after treatment/Initial tensile strength $X_0$)×100

Wherein tensile strength X represents a tensile strength measured after the treatment conducted under conditions at 121° C., at 2 atm, and at 100% RH for a predetermined period of time, and tensile strength $X_0$ represents an initial tensile strength before the treatment.
○: The tensile strength retention ratio after 10 hours is 80% or more.
Δ: The tensile strength retention ratio after 10 hours is 50 to less than 80%.
x: The tensile strength retention ratio after 10 hours is less than 50%.

(9) Burning Properties

A film sample was evaluated in accordance with the UL-94VTM method. A sample was cut into a 20 cm×5 cm specimen, and the specimen was allowed to stand in an atmosphere at 23±2° C. and at 50±5% RH for 48 hours, and then the specimen was vertically held so that the lower end of the specimen was positioned 10 mm above a burner. The lower end of the specimen was brought into contact with a flame for 3 seconds using as a heating source a Bunsen burner having an inner diameter of 9.5 mm and a flame length of 19 mm. The flame retardancy was evaluated according to the ratings VTM-0, VTM-1, and VTM-2 for evaluation criteria, and, in the measurement with a frequency of n=5, the rating which the specimen was the most frequently ranked as was taken as a rating for the evaluation result.

(10) Surface Roughness Ra, Rmax

Using a stylus-type surface roughness meter (SURF-CORDER SE-30C), manufactured by Kosaka Laboratory Ltd., a measurement was made with respect to the surface of the polyester film under the conditions shown below, and a calculated center line average roughness Ra and maximum height Rmax were individually measured 4 times, and each average of the four measured values was obtained and evaluated in accordance with the criteria shown below. With respect to the sample rated ○ evaluation in the center line average roughness Ra (A Evaluation), a result of evaluation in accordance with further strict criteria (B Evaluation: ○++, ○+) was also shown.

<Conditions for Measurement>
Measured length: 2.5 mm
Cut-off: 0.25 mm
Measurement atmosphere: In air at room temperature
<Ra (A Evaluation)>
○: 0.1 to less than 2 μm
x: Less than 0.1 μm or 2 μm or more
<Ra (B Evaluation)>
○++: 0.1 to less than 0.5 μm
○+: 0.5 to less than 2 μm
<Evaluation Criteria: Rmax>
○: Less than 3 μm
x: 3 μm or more Example 1

Using, as polyester, polyethylene terephthalate having an intrinsic viscosity of 0.60 dl/g and having a terminal carboxyl group concentration of 25 equivalent/ton (transesterification catalyst: manganese acetate tetrahydrate; polymerization catalyst: antimony trioxide), a composition containing aluminum dimethylphosphinate (which is shown as phosphorus compound A in Table 1; average particle diameter: 2 μm; coarse particles (having a maximum length of 10 μm or more) were removed by pulverization and classification) in an amount of 5% by weight, based on the weight of the polyester film, was dried by a dryer at 170° C. for 3 hours, and then charged into an extruder, and melt-kneaded at a melt temperature of 280° C. and extruded through a die slit at 280° C., and then cooled and solidified on a casting drum having a surface temperature set at 25° C. to form an unstretched film.

The unstretched film was introduced to a roll group heated to 100° C., and stretched 3.5-fold in the longitudinal direction (lengthwise direction) and cooled by a roll group at 25° C. Subsequently, the both ends of the longitudinally stretched film were held with clips and the film was introduced to a tenter, and stretched 3.8-fold in the direction perpendicular to the longitudinal direction (crosswise direction) in an atmosphere heated to 120° C. Then, the resultant film was subjected to heat setting at 230° C. in the tenter, and relaxed 2% in the width direction at 180° C., and then gradually and uniformly cooled to room temperature to obtain a biaxially stretched film having a thickness of 50 μm. The properties of the obtained film are shown in Table 1. The film in the present Example had excellent flame retardancy, excellent mechanical properties, and excellent hydrolytic resistance. Further, Ra was 0.10 μm and Rmax was 1.8 μm, which are indices of the surface roughness, and the film-forming properties and the mechanical properties were excellent.

Example 2

Substantially the same procedure as in Example 1 was conducted, except that the flame retardant was changed to aluminum diethylphosphinate (which is shown as phosphorus compound B in Table 1; average particle diameter: 2 μm; coarse particles (having a maximum length of 10 μm or more) were removed by pulverization and classification), to obtain a biaxially stretched film having a thickness of 50 µm. The properties of the obtained film are shown in Table 1. The film in the present Example had excellent film-forming properties, excellent flame retardancy, excellent mechanical properties, and excellent hydrolytic resistance.

Example 3

Substantially the same procedure as in Example 2 was conducted, except that the amount of the flame retardant contained was changed to 3% by weight, to obtain a biaxially stretched film having a thickness of 50 µm. The properties of the obtained film are shown in Table 1. The film in the present Example had excellent film-forming properties, excellent flame retardancy, excellent mechanical properties, and excellent hydrolytic resistance.

Example 4

Substantially the same procedure as in Example 2 was conducted, except that the amount of the flame retardant contained was changed to 10% by weight, to obtain a biaxially stretched film having a thickness of 50 µm. The properties of the obtained film are shown in Table 1. The film in the present Example had excellent film-forming properties, excellent flame retardancy, excellent mechanical properties, and excellent hydrolytic resistance.

Example 5

Substantially the same procedure as in Example 2 was conducted, except that the amount of the flame retardant contained was changed to 15% by weight, to obtain a biaxially stretched film having a thickness of 50 µm. The properties of the obtained film are shown in Table 1. The film in the present Example had excellent film-forming properties, excellent flame retardancy, excellent mechanical properties, and excellent hydrolytic resistance.

Example 6

Substantially the same procedure as in Example 2 was conducted, except that the amount of the flame retardant contained was changed to 30% by weight, to obtain a biaxially stretched film having a thickness of 50 µm. The properties of the obtained film are shown in Table 1. The film in the present Example had excellent film-forming properties, excellent flame retardancy, excellent mechanical properties, and excellent hydrolytic resistance.

Example 7

Using, as polyester, polyethylene-2,6-naphthalenedicarboxylate having an intrinsic viscosity of 0.57 dl/g and having a terminal carboxyl group concentration of 25 equivalent/ton (transesterification catalyst: manganese acetate tetrahydrate; polymerization catalyst: antimony trioxide), a composition containing aluminum diethylphosphinate (phosphorus compound B; average particle diameter: 2 µm; coarse particles (having a maximum length of 10 µm or more) were removed by pulverization and classification) in an amount of 5% by weight, based on the weight of the polyester film, was dried by a dryer at 180° C. for 5 hours, and then charged into an extruder, and melt-kneaded at a melt temperature of 300° C. and extruded through a die slit at 300° C., and then cooled and solidified on a casting drum having a surface temperature set at 60° C. to form an unstretched film.

The unstretched film was introduced to a roll group heated to 140° C., and stretched 3.5-fold in the longitudinal direction (lengthwise direction) and cooled by a roll group at 60° C. Subsequently, the both ends of the longitudinally stretched film were held with clips and the film was introduced to a tenter, and stretched 3.5-fold in the direction perpendicular to the longitudinal direction (crosswise direction) in an atmosphere heated to 150° C. Then, the resultant film was subjected to heat setting at 230° C. in the tenter, and relaxed 2% in the width direction at 180° C., and then gradually and uniformly cooled to room temperature to obtain a biaxially stretched film having a thickness of 50 µm. The properties of the obtained film are shown in Table 1. The film in the present Example had excellent film-forming properties, excellent flame retardancy, excellent mechanical properties, and excellent hydrolytic resistance.

Example 8

Substantially the same procedure as in Example 7 was conducted, except that the amount of the flame retardant contained was changed to 15% by weight, to obtain a biaxially stretched film having a thickness of 50 µm. The properties of the obtained film are shown in Table 1. The film in the present Example had excellent film-forming properties, excellent flame retardancy, excellent mechanical properties, and excellent hydrolytic resistance.

Example 9

Substantially the same procedure as in Example 2 was conducted, except that the average particle diameter of the flame retardant was changed from 2 µm to 3 µm, to obtain a biaxially stretched film having a thickness of 50 µm. The properties of the obtained film are shown in Table 1. The film in the present Example had excellent film-forming properties, excellent flame retardancy, excellent mechanical properties, and excellent hydrolytic resistance.

Comparative Example 1

Substantially the same procedure as in Example 1 was conducted, except that the flame retardant was not added, to obtain a biaxially stretched film having a thickness of 50 µm. The properties of the obtained film are shown in Table 1. The film in the present Comparative Example had excellent film-forming properties, excellent mechanical properties, excellent hydrolytic resistance, and excellent external appearance, but was unsatisfactory in the flame retardancy.

Comparative Example 2

Substantially the same procedure as in Example 1 was conducted, except that the amount of the flame retardant contained was changed to 45% by weight, to obtain a biaxially stretched film having a thickness of 50 µm. The properties of the obtained film are shown in Table 1. In the present Comparative Example, the film-forming properties were unsatisfactory so that a biaxially stretched film was not able to be obtained.

Comparative Example 3

Substantially the same procedure as in Example 4 was conducted, except that the flame retardant was changed to aluminum diethylphosphinate from which coarse particles were not removed (which is shown as phosphorus compound B' in Table 1; average particle diameter: 2 μm), to obtain a biaxially stretched film having a thickness of 50 μm. The properties of the obtained film are shown in Table 1. In the present Comparative Example, the film-forming properties were unsatisfactory, and the obtained biaxially stretched film had a rough surface and had poor mechanical properties and poor hydrolytic resistance.

Comparative Example 4

Substantially the same procedure as in Example 4 was conducted, except that the flame retardant was changed to aluminum diethylphosphinate from which coarse particles were not removed (which is shown as phosphorus compound B' in Table 1; average particle diameter: 30 μm), to obtain a biaxially stretched film having a thickness of 50 μm. The properties of the obtained film are shown in Table 1. In the present Comparative Example, the film-forming properties were unsatisfactory, and the obtained biaxially stretched film had a rough surface and had poor mechanical properties and poor hydrolytic resistance.

In Table 1, PET indicates polyethylene terephthalate, and PEN indicates polyethylene-2,6-naphthalenedicarboxylate.

INDUSTRIAL APPLICABILITY

The flame-retardant biaxially oriented polyester film of the present invention has excellent film-forming properties, and has high flame retardancy without lowering the mechanical properties and hydrolytic resistance of a polyester, such as polyethylene terephthalate or polyethylene naphthalate, and therefore can be advantageously used in, for example, a flexible printed circuit board, a flat cable, and a back sheet for solar cell.

The invention claimed is:

1. A flame-retardant biaxially oriented polyester film consisting essentially of, based on the weight of the polyester film, 70 to 99% by weight of polyethylene terephthalate or polyethylene naphthalate, and 1 to 30% by weight of flame retardant particles having an average particle diameter of 1.5 to 3.0 μm and being represented by the following formula (1) or formula (2):

TABLE 1

|  | Example 1 | Example 2 | Example 3 | Example 4 | Example 5 | Example 6 | Example 7 |
|---|---|---|---|---|---|---|---|
| Resin | PET | PET | PET | PET | PET | PET | PEN |
| Phosphorus compound | A | B | B | B | B | B | B |
| Wt % | 5 | 5 | 3 | 10 | 15 | 30 | 5 |
| Phosphorus concentration Wt % | 1.5 | 1.2 | 0.7 | 2.4 | 3.6 | 7.2 | 1.2 |
| Coarse particles present or not | ○ | ○ | ○ | ○ | ○ | ○ | ○ |
| Average particle diameter of phosphorus compound μm | 2 | 2 | 2 | 2 | 2 | 2 | 2 |
| Film-forming properties | ○ | ○ | ○ | ○ | ○ | ○ | ○ |
| Surface roughness Ra (A Evaluation) | ○ | ○ | ○ | ○ | ○ | ○ | ○ |
| Surface roughness Ra (B Evaluation) | ○++ | ○++ | ○++ | ○++ | ○++ | ○++ | ○++ |
| Surface roughness Rmax | ○ | ○ | ○ | ○ | ○ | ○ | ○ |
| Mechanical properties | ○ | ○ | ○ | ○ | ○ | ○ | ○ |
| Hydrolytic resistance | ○ | ○ | ○ | ○ | ○ | ○ | ○ |
| Burning properties | VTM-0 | VTM-0 | VTM-0 | VTM-0 | VTM-0 | VTM-0 | VTM-0 |

|  | Example 8 | Example 9 | Comparative Example 1 | Comparative Example 2 | Comparative Example 3 | Comparative Example 4 |
|---|---|---|---|---|---|---|
| Resin | PEN | PET | PET | PET | PET | PET |
| Phosphorus compound | B | B | — | A | B' | B' |
| Wt % | 15 | 5 | 0 | 45 | 10 | 10 |
| Phosphorus concentration Wt % | 3.5 | 1.2 | 0 | 10.4 | 2.4 | 2.4 |
| Coarse particles present or not | ○ | ○ | ○ | ○ | x | x |
| Average particle diameter of phosphorus compound μm | 2 | 3 | — | 2 | 2 | 30 |
| Film-forming properties | ○ | ○ | ○ | x | Δ | x |
| Surface roughness Ra (A Evaluation) | ○ | ○ | ○ | — | x | x |
| Surface roughness Ra (B Evaluation) | ○++ | ○+ | ○++ | — | — | — |
| Surface roughness Rmax | ○ | ○ | ○ | — | x | x |
| Mechanical properties | ○ | ○ | ○ | — | x | x |
| Hydrolytic resistance | ○ | ○ | ○ | — | Δ | Δ |
| Burning properties | VTM-0 | VTM-0 | VTM-2 | — | VTM-0 | VTM-0 |

[Chem. 1]

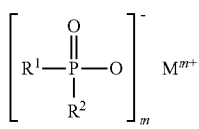
(1)

wherein each of $R^1$ and $R^2$ represents hydrogen, an alkyl group having 1 to 6 carbon atoms and/or an aryl group, M represents a metal, and m represents a valence of M,

[Chem. 2]

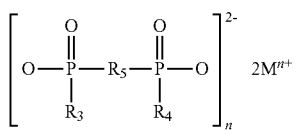
(2)

wherein each of $R^3$ and $R^4$ represents hydrogen, an alkyl group having 1 to 6 carbon atoms and/or an aryl group, $R^5$ represents an alkylene group having 1 to 6 carbon atoms or an arylene group, allcylarylene group, or arylalkylene group having 6 to 10 carbon atoms, M represents a metal, and n represents a valence of M, wherein the biaxially oriented polyester film has an Rmax (maximum height) of 1.8 μm to less than 3 μm, wherein the flame-retardant biaxially oriented polyester film has a surface roughness Ra of 0.1 to less than 0.5 μm.

wherein the flame-retardant biaxially oriented polyester film has a mechanical strength of 150 MPa or more, wherein the number of coarse particles having a maximum length of 10 μm or more contained in the polyester film is 10/m² or less.

2. The flame-retardant biaxially oriented polyester film according to claim 1, wherein the polyester film obtained after being treated in a saturated steam at 121° C. under 2 atm for 10 hours has a tensile strength retention ratio of 80% or more.

3. A flame-retardant polyester film laminate comprising the flame-retardant biaxially oriented polyester film according to claim 2 and a metal layer, the polyester film and the metal layer being laminated on one another.

4. The flame-retardant polyester film laminate according to claim 3, which is for use in a flexible printed circuit board.

5. A flexible circuit board using the flame-retardant polyester film laminate according to claim 3.

6. A flame-retardant polyester film laminate comprising the flame-retardant biaxially oriented polyester film according to claim 1 and a metal layer, the polyester film and the metal layer being laminated on one another.

7. The flame-retardant polyester film laminate according to claim 6, which is for use in a flexible printed circuit board.

8. A flexible circuit board using the flame-retardant polyester film laminate according to claim 6.

9. The flame-retardant biaxially oriented polyester film according to claim 1, wherein the polyester film consists essentially of, based on the weight of the polyester film, 70 to 97% by weight of polyethylene terephthalate or polyethylene naphthalate, and 3 to 30% by weight of the flame retardant particles.

10. The flame-retardant biaxially oriented polyester film according to claim 1, wherein the polyester film consists essentially of, based on the weight of the polyester film, 70 to 95% by weight of polyethylene terephthalate or polyethylene naphthalate, and 5 to 30% by weight of the flame retardant particles.

11. The flame-retardant biaxially oriented polyester film according to claim 1, wherein the polyester film consists essentially of, based on the weight of the polyester film, 70 to 90% by weight of polyethylene terephthalate or polyethylene naphthalate, and 10 to 30% by weight of the flame retardant particles.

\* \* \* \* \*